United States Patent
Hayase et al.

(10) Patent No.: US 10,109,973 B2
(45) Date of Patent: Oct. 23, 2018

(54) INSULATING BUSBAR AND MANUFACTURING METHOD

(71) Applicant: FUJI ELECTRIC CO., LTD., Kanagawa (JP)

(72) Inventors: Yuji Hayase, Tachikawa (JP); Katsumi Taniguchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 120 days.

(21) Appl. No.: 15/203,755

(22) Filed: Jul. 6, 2016

(65) Prior Publication Data

US 2017/0018884 A1 Jan. 19, 2017

(30) Foreign Application Priority Data

Jul. 14, 2015 (JP) .................................. 2015-140433

(51) Int. Cl.
| | | |
|---|---|---|
| *H01R 11/09* | (2006.01) | |
| *H01R 43/18* | (2006.01) | |
| *H01R 25/16* | (2006.01) | |
| *H01R 9/24* | (2006.01) | |
| *H01R 43/24* | (2006.01) | |
| *H05K 7/14* | (2006.01) | |

(52) U.S. Cl.
CPC .......... *H01R 43/18* (2013.01); *H01R 9/2458* (2013.01); *H01R 25/162* (2013.01); *H01R 43/24* (2013.01); *H05K 7/1432* (2013.01)

(58) Field of Classification Search
CPC ...... H01R 31/00; H01R 31/02; H01R 9/2458; H01R 5/08
USPC .................................. 439/723, 721, 212, 949
See application file for complete search history.

(56) References Cited

U.S. PATENT DOCUMENTS

| | | | | |
|---|---|---|---|---|
| 5,797,757 | A * | 8/1998 | Aoki | H01R 12/73 439/101 |
| 5,904,582 | A * | 5/1999 | Makino | H05K 3/225 439/76.2 |
| 6,093,041 | A * | 7/2000 | Kay | H01R 31/085 439/225 |
| 6,739,920 | B2 * | 5/2004 | Fujii | H01R 31/085 439/723 |
| 9,373,585 | B2 * | 6/2016 | Uzoh | H01L 23/5328 |
| 9,674,940 | B2 * | 6/2017 | Lee | H05K 1/0206 |
| 2010/0134979 | A1 | 6/2010 | Obiraki et al. | |

FOREIGN PATENT DOCUMENTS

| | | |
|---|---|---|
| JP | 2006-217769 A | 8/2006 |
| JP | 1432913 B2 | 3/2010 |
| JP | 2010-274602 A | 12/2010 |
| JP | 2011-35277 A | 2/2011 |
| JP | 2012-235625 A | 11/2012 |
| JP | 5549491 B2 | 7/2014 |

* cited by examiner

*Primary Examiner* — Phuong Chi T Nguyen

(57) ABSTRACT

To realize an insulating busbar that has both low inductance and high withstand voltage, provided is an insulating busbar that connects to a module on which is mounted a semiconductor chip, including a plurality of circuit conductors; a plurality of connection terminals that respectively electrically connect the circuit conductors to the module; and an insulating resin portion that is formed integrally between each of the circuit conductors and at least a portion of a region around each connection terminal and does not have any gaps between the circuit semiconductors.

6 Claims, 8 Drawing Sheets

INSULATING BUSBAR AND MANUFACTURING METHOD

The contents of the following Japanese patent application are incorporated herein by reference:
NO. 2015-140433 filed on Jul. 14, 2015.

BACKGROUND

1. Technical Field

The present invention relates to an insulating busbar and a manufacturing method.

2. Related Art

A conventional busbar is known that is electrically connected to a semiconductor unit housing a power semiconductor device or the like, as shown in Patent Document 1, for example.
Patent Document 1: Japanese Patent Application Publication No. 2010-129867

A busbar preferably has a high withstand voltage.

SUMMARY

According to a first aspect of the present invention, provided is an insulating busbar that connects to a module on which is mounted a semiconductor chip, the insulating busbar comprising a plurality of circuit conductors; a plurality of connection terminals that respectively electrically connect the circuit conductors to the module; and an insulating resin portion that is formed integrally between each of the circuit conductors and at least a portion of a region around each connection terminal and does not have any gaps between the circuit semiconductors.

According to a second aspect of the present invention, provided is a method of manufacturing an insulating busbar, comprising arranging a plurality of circuit conductors and a plurality of connection terminals at predetermined positions within a resin injection mold; and forming a resin portion that does not have gaps around the plurality of circuit conductors and the plurality of connection terminals, by injecting insulating resin into the resin injection mold in a state where the absolute pressure inside the resin injection mold has been reduced to be less than or equal to 80 kPa.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
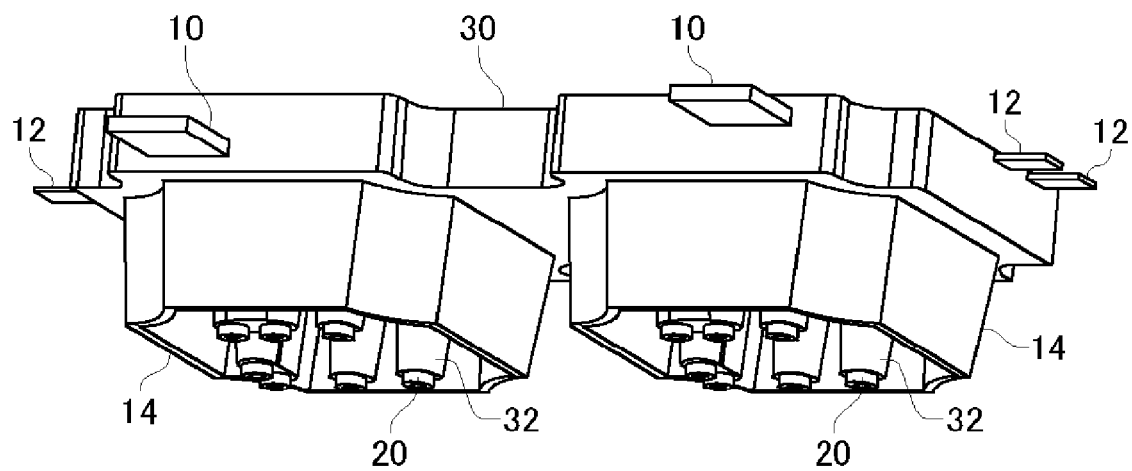
FIG. 1 is a perspective view of an exemplary insulating busbar 100 according to an embodiment of the present invention.

FIG. 1 is a perspective view of an exemplary insulating busbar 100 according to an embodiment of the present invention. The insulating busbar 100 is electrically connected to a module on which is mounted a semiconductor chip such as a power semiconductor.

The insulating busbar 100 includes one or more main circuit conductors 10, one or more auxiliary circuit conductors 12, a plurality of connection terminals 20, and a resin portion 30. The main circuit conductor 10 is formed of a metal material such as copper (oxygen-free copper C1020, as a specific example), aluminum, or an alloy including aluminum. The main circuit conductor 10 may be board-shaped. A curved portion, opening portion, protruding portion, or the like may be formed in the main circuit conductor 10, and a conduction pattern is also formed in the main circuit conductor 10. The main circuit conductor 10 may pass a large current flowing through the semiconductor chip such as the power semiconductor.

The auxiliary circuit conductor 12 may be board-shaped and have a specified pattern, in the same manner as the main circuit conductor 10. The cross-sectional area of the auxiliary circuit conductor 12 may be less than the cross-sectional area of the main circuit conductor 10. The auxiliary circuit conductor 12 may pass a smaller current than the main circuit conductor 10. The auxiliary circuit conductor 12 transmits a control signal of a semiconductor transistor, for example.

The auxiliary circuit conductor 12 is formed of the same metal material as the main circuit conductor 10, for example. As a result, the linear expansion coefficients of the main circuit conductor 10 and the auxiliary circuit conductor 12 can be matched. The difference between the linear expansion coefficients of the main circuit conductor 10, the auxiliary circuit conductor 12, the connection terminals 20, and the resin portion 30 is preferably no greater than 10%. In this way, even when a heat cycle test has been performed, for example, deformation of the insulating busbar 100 can be prevented.

Each connection terminal 20 is secured to a corresponding main circuit conductor 10 or auxiliary circuit conductor 12. Each connection terminal 20 may be mechanically secured to the corresponding main circuit conductor 10 or auxiliary circuit conductor 12, or may be secured thereto using a bonding material such as a solder. Each connection terminal 20 has a screw structure at one end thereof, and may be secured in a screw hole of the corresponding main circuit conductor 10 or auxiliary circuit conductor 12. Each connection terminal 20 electrically connects the corresponding main circuit conductor 10 or auxiliary circuit conductor 12 to the module on which is mounted the semiconductor chip such as the power semiconductor.

The resin portion 30 is formed between the circuit conductors of each of a plurality of the main circuit conductors 10 and a plurality of the auxiliary circuit conductors 12, and insulates these circuit conductors from each other. The resin portion 30 of this example is formed not only between the circuit conductors, but also wraps around each circuit conductor. An extending portion of each circuit conductor that is formed extending from a portion of an end of the circuit conductor is exposed from the resin portion 30. With these extending portions, it is possible to electrically connect each circuit conductor to the outside. The resin portion 30 preferably covers all portions of each circuit conductor other than the extending portion.

The resin portion 30 covers at least a portion of the periphery of each connection terminal 20. The resin portion 30 covers at least the region near the portion of each connection terminal 20 connected to a circuit conductor. A portion of each connection terminal 20 protrudes from the resin portion 30 covering the main circuit conductors 10 and the auxiliary circuit conductors 12. However, it should be noted that the resin portion 30 of this example has covering sections 32 that cover the side walls of the protruding portions of the connection terminals 20. The portion of the resin portion 30 covering the periphery of the main circuit conductors 10 and the auxiliary circuit conductors 12 and the portion of the resin portion 30 covering the periphery of the connection terminals 20 are formed integrally.

At least the portion of the resin portion 30 between the circuit conductors is formed without gaps. The resin portion 30 does not have any empty space intentionally formed in a region sandwiched by two circuit conductors, nor any empty space unintentionally formed in a region sandwiched by two circuit conductors. Empty space that is unintentionally formed refers to air bubbles that are visible in the resin, for example. As an example, by using resin with low viscosity, it is possible to form the resin portion 30 without any empty spaces such as air bubbles.

The insulating busbar 100 further includes a wall structure 14 provided to surround the connection terminals 20. The wall structure 14 may be formed integrally with the resin portion 30, or formed separately from the resin portion 30. The wall structure 14 is formed to protrude in the same direction as the connection terminals 20 from the surface of the resin portion 30 from which the connection terminals 20 protrude. The height of the wall structure 14 may be the same as the height of the connection terminals 20.

The insulating busbar 100 may include a plurality of the wall structures 14. Each wall structure 14 surrounds one or more of the connection terminals 20. A different module may be connected to each group of connection terminals 20 surrounded by a wall structure 14.

The insulating busbar 100 of this example has the insulating resin formed without gaps between the circuit conductors and/or seals the circuit conductors and the connection terminals 20 with resin formed integrally, and can therefore increase the insulation of the busbar. Furthermore, the ends of the circuit conductors that are not the extending portions are not exposed, and therefore it is possible to prevent discharge between the ends of the circuit conductors. Accordingly, even when the distance between the circuit conductors is reduced, discharge between the circuit conductors can be prevented. Since the distance between the circuit conductors can be reduced, it is possible to reduce the inductance between the circuit conductors. Accordingly, the insulating busbar 100 can realize both high withstand voltage and low inductance.

Figure 2:
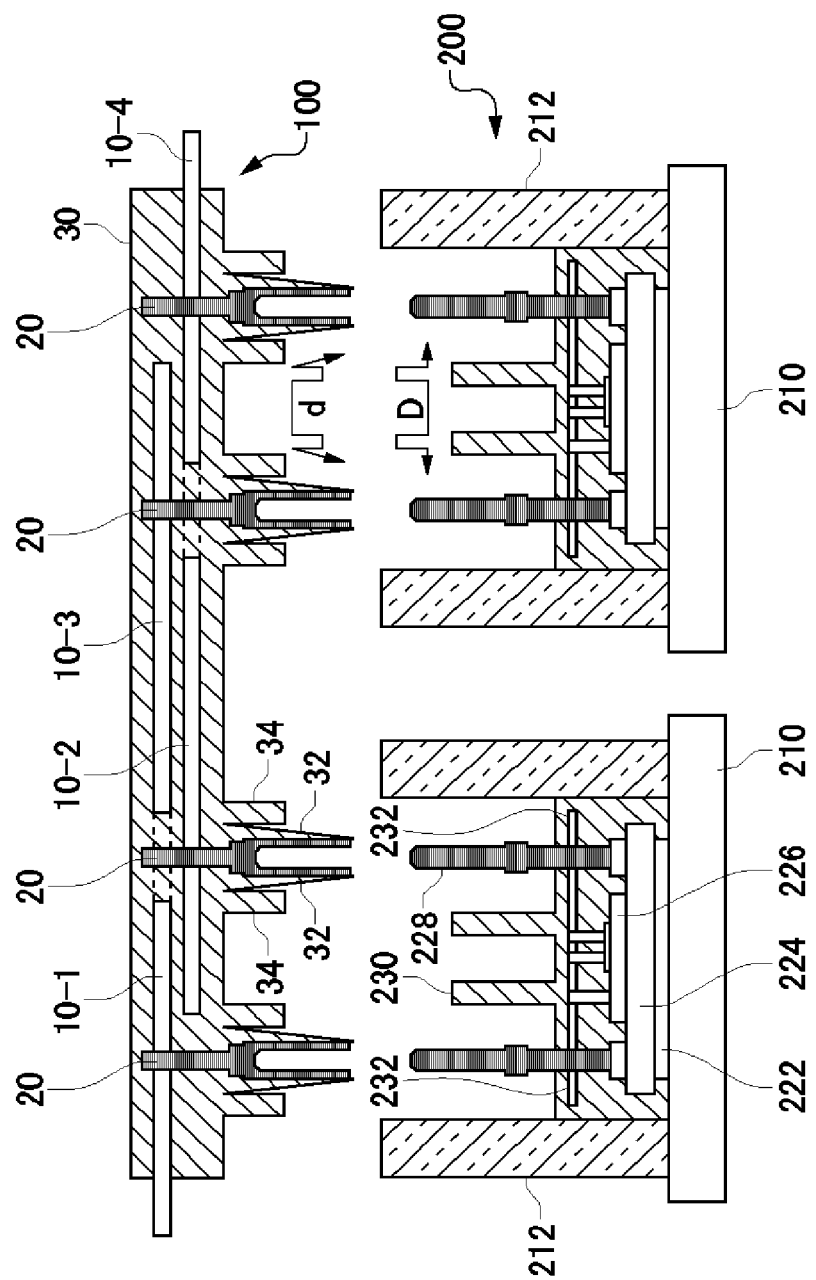
FIG. 2 is a schematic cross-sectional view of an exemplary insulating busbar 100 and module 200.

FIG. 2 is a schematic cross-sectional view of an exemplary insulating busbar 100 and module 200. The structure of the insulating busbar 100 shown in FIG. 2, such as the arrangement of the connection terminals 20, does not necessarily match the structure of the insulating busbar 100 shown in FIG. 1. In FIG. 2, the wall structures 14 and the auxiliary circuit conductors 12 of the insulating busbar 100 are omitted. The module 200 has a semiconductor chip 226 such as a power semiconductor mounted thereon, and the insulating busbar 100 is electrically connected to the semiconductor chip 226.

The module 200 includes a base 210, a base substrate 224, a connecting portion 222, a wall structure 212, a resin portion 230, a conduction pattern 232, and a plurality of connection terminals 228. The base substrate 224 has the semiconductor chip 226 mounted thereon. The connecting portion 222 connects the base substrate 224 to the base 210 of the module 200. Furthermore, the connecting portion 222 may function as a heat releasing section that allows the heat of the base substrate 224 to escape to the base 210.

The wall structure 212 surrounds the base substrate 224, the connecting portion 222, the resin portion 230, the conduction pattern 232, and the connection terminals 228 on the front surface of the base 210. The conduction pattern 232 is electrically connected to the semiconductor chip 226 above the base substrate 224.

Each connection terminal 228 is electrically connected to the semiconductor chip 226 via a wiring pattern on the base substrate 224 or the conduction pattern 232, for example. The ends of the connection terminals 228 are connected to the connection terminals 20 of the insulating busbar 100. The connection terminals 228 of this example are inserted through insertion holes provided in the connection terminals 20.

The resin portion 230 seals the base substrate 224, the connecting portion 222, the conduction pattern 232, and a portion of the connection terminals 228. The ends of the connection terminals 228 protrude from the resin portion 230.

Each connection terminal 20 of the insulating busbar 100 engages with a connection terminal 228 of the module 200. The connection terminals 20 of this example have insertion holes through which the connection terminals 228 of the module 200 are inserted.

Each connection terminal 20 is secured to a corresponding main circuit conductor 10. In FIG. 2, four connection terminals 20 are secured to four main circuit conductors 10-1 to 10-4. Each main circuit conductor 10 is formed in a different layer or in a different region in the same layer. The resin portion 30 is formed between each main circuit conductor 10.

The spacing between two main circuit conductors 10 formed in different layers may be less than or equal to 3 mm. In this way, it is possible to lower the inductance between the main circuit conductors 10. It should also be noted that the spacing between two main circuit conductors 10 is preferably greater than or equal to 2 mm. In this way, it is possible to ensure the withstand voltage between the main circuit conductors 10. However, the spacing between two main circuit conductors 10 is not limited to the range described above. The spacing between main circuit conductors 10 can be set as desired according to the characteristics desired for the insulating busbar 100.

The resin portion 30 of this example includes uneven portions 34. Each uneven portion 34 is provided between two connection terminals 20, and expands the creepage distance d between the two connection terminals 20. The uneven portions 34 may protrude in the same direction as the connection terminals 20 from the surface of the resin portion 30 from which the connection terminals 20 protrude. By providing the uneven portions 34, it is possible to expand the creepage distance d between connection terminals 20 to be greater than the clearance distance between the connection terminals 20, and therefore it is possible to improve the withstand voltage between the connection terminals 20. Furthermore, the uneven portions 34 are formed integrally with the resin portion 30. In this way, the strength relative to discharge breakdown can be improved in comparison to a case where the uneven portions 34 are affixed to the resin portion 30 through adhesion or the like.

The length by which each uneven portion 34 protrudes from the front surface of the resin portion 30 may be greater than the width of an uneven portion 34 in a direction parallel to the surface of the resin portion 30. Furthermore, the protruding length of each uneven portion 34 may be approximately the same as the width of each uneven portion 34. This width may refer to the minimum length of an uneven portion 34 in a plane parallel to the front surface of the resin portion 30. The protruding length of each uneven portion 34 may be at least two times or at least three times the width of the uneven portion 34. The protruding length of each uneven portion 34 may be greater than or equal to half of the length by which the connection terminal 20 protrudes from the front surface of the resin portion 30. The protruding length of each uneven portion 34 may be the same as the protruding length of a connection terminal 20. The protruding length of each uneven portion 34 may be less than the protruding length of a connection terminal 20.

The resin portion 230 of the module 200 may include uneven portions in the same manner as the resin portion 30. In this way, it is possible to expand the creepage distance D between the connection terminals 228 of the module 200 and improve the withstand voltage. The uneven portions 34 of the resin portion 30 may be provided at positions that are not opposite the uneven portions of the resin portion 230 when in a state where the insulating busbar 100 is connected to the module 200. In this way, it is possible to ensure enough space for the uneven portions 34 to protrude.

The distance between a connection terminal 20 and an uneven portion 34 in this example is less than the distance between an uneven portion and a connection terminal 228 in the module 200. The uneven portions 34 may be arranged adjacent to the connection terminals 20. The distance between an uneven portion 34 and a covering section 32 may be less than or equal to ¼ of the clearance distance between two connection terminals 20.

At least one of the circuit conductors may be covered by a material whose adhesiveness with the resin portion 30 is greater than that of nickel. For example, the main circuit conductors 10 are covered by roughened nickel plating. In this way, the main circuit conductors 10 can be prevented from peeling away from the resin portion 30.

The resin portion 30 is preferably formed of a resin with a glass transition point Tg that is greater than or equal to 250° C. and a viscosity μ when being worked that is less than or equal to 50 Pa·s. In this way, it is possible to form the resin portion 30 with sufficient endurance to be used at high temperatures and without air bubbles or the like being mixed in. The resin of the resin portion 30 more preferably has a viscosity μ when being worked that is less than or equal to 10 Pa·s. The resin portion 30 may be formed of a catalytic curing resin. The resin portion 30 may be formed of a polyolefin resin or a maleimide resin. The resin portion 30 may be formed of P-TCP (poly-tricyclopentadiene).

Figure 3:
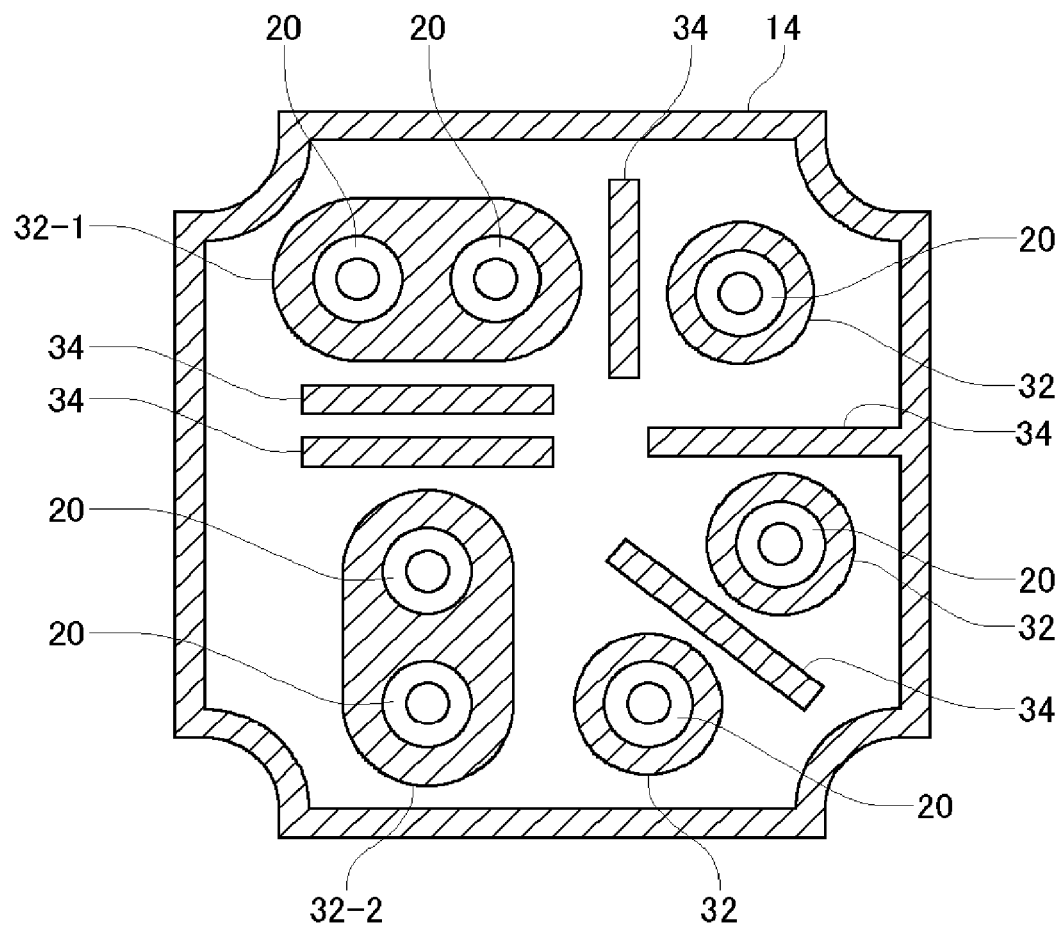
FIG. 3 shows an exemplary arrangement of the connection terminals 20, the covering sections 32, and the uneven portions 34.

FIG. 3 shows an exemplary arrangement of the connection terminals 20, the covering sections 32, and the uneven portions 34. FIG. 3 shows a bottom surface of the insulating busbar 100 as seen from the module 200 side. One covering section 32 may be provided in common to a plurality of connection terminals 20. In this example, a covering section 32-1 and a covering section 32-2 each cover the side walls of two connection terminals 20.

The connection terminals 20 include high-voltage connection terminals 20 to which a high voltage is applied and low-voltage connection terminals 20 to which a low voltage is applied. Two or more high-voltage connection terminals 20 that are adjacent to each other may be covered by a common covering section 32, and two or more low-voltage connection terminals 20 that are adjacent to each other may be covered by a common covering section 32. Furthermore, two or more connection terminals 20 that are connected to the same main circuit conductor 10 may be covered by a common covering section 32.

Each uneven portion 34 is provided between two connection terminals 20. An uneven portion 34 may be provided between a low-voltage connection terminal 20 and a high-voltage connection terminal 20. An uneven portion 34 may be provided between two connection terminals 20 connected to different main circuit conductors 10. An uneven portion 34 need not be provided between at least one set of two connection terminals 20.

For example, an uneven portion 34 need not be provided between two high-voltage connection terminals 20. Two high-voltage connection terminals 20 may be covered by a common covering section 32, or may be independently covered by respective covering sections 32.

A plurality of uneven portions 34 may be formed between two connection terminals 20. For example, two uneven portions 34 that are parallel to each other may be formed between the connection terminal 20 covered by the covering section 32-1 and the connection terminal 20 covered by the covering section 32-2. The number of uneven portions 34 provided may be determined according to the distance between two connection terminals 20.

For example, if there is a large distance between two connection terminals 20, a larger number of uneven portions 34 may be provided. In this way, as many uneven portions 34 as possible can be arranged according to the available space. Furthermore, if there is a small distance between two connection terminals 20, a greater number of uneven portions 34 may be provided. In this way, when the distance between two connection terminals 20 is smaller, the degree of expansion of the creepage distance can be increased and the short distance can be compensated for by the number of uneven portion 34.

The height of each uneven portion 34 may be the same, or may be different. The width of each uneven portion 34 may be the same, or may be different. The length of each uneven portion 34 may be different. Two uneven portions 34 provided between two different sets of connection terminals 20 may be connected to each other. Each uneven portion 34 may have a region with a linear shape and a region with a bent shape, as seen from a bottom surface view. The uneven portions 34 may be formed to surround connection terminals 20 or covering sections 32.

At least one uneven portion 34 may be formed extending from a wall structure 14. At least one covering section 32 may be formed extending from a wall structure 14. In this way, the mechanical strength of the uneven portion 34 and the covering section 32 can be improved.

Figure 4:
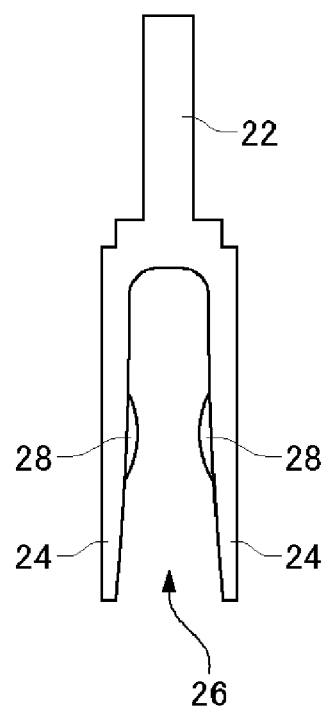
FIG. 4 is a cross-sectional view of an exemplary connection terminal 20.

FIG. 4 is a cross-sectional view of an exemplary connection terminal 20. The connection terminal 20 includes a base portion 22, a connecting portion 24, and an elastic portion 28. The base portion 22, the connecting portion 24, and the elastic portion 28 may each be formed of a conductive material, or may be covered in a conductive material.

The base portion 22 has a rod shape, such as a cylindrical column or polygonal column, and one end thereof is secured to a main circuit conductor 10 or auxiliary circuit conductor 12. The other end of the base portion 22 is provided with the connecting portion 24. The connecting portion 24 has a cylindrical shape, such as a round cylinder or a polygonal cylinder. The end of the connecting portion 24 that is opposite the base portion 22 is provided with an insertion hole 26.

The insertion hole 26 has a connection terminal 228 of the module 200 inserted therethrough. The elastic portion 28 that presses the terminal inserted into the insertion hole 26, which is a connection terminal 228 in this example, is provided inside the insertion hole 26. By including the elastic portion 28 in a large number of the connection terminals 20, the insulating busbar 100 and the module 200 can be secured to each other. Each connection terminal 20 may support a weight of approximately 10 N. Each elastic portion 28 may be formed integrally with a connecting portion 24, or may be formed as a separate component. If an elastic portion 28 is formed as a separate component from a connecting portion 24, the elastic portion 28 is secured to the connecting portion 24 by being embedded within the insertion hole 26, for example.

With this structure, there is no need to provide the insulating busbar 100 with through-holes for securing the module 200 with screw engagement. Furthermore, it is possible to omit the step of screw engagement during assembly.

Figure 5:
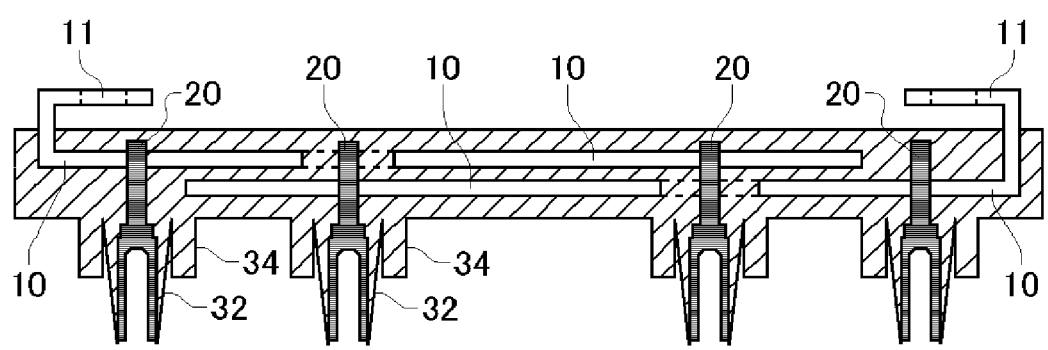
FIG. 5 is a cross-sectional view of another exemplary insulating busbar 100.

FIG. 5 is a cross-sectional view of another exemplary insulating busbar 100. In the insulating busbar 100 described in FIGS. 1 to 4, the extending portions of the main circuit conductors 10 are exposed at the side surface side of the insulating busbar 100, but in the insulating busbar 100 of this example, the ends 11 of the extending portions of the main circuit conductors 10 are arranged on the front surface side of the insulating busbar 100. The remaining structure of the insulating busbar 100 not relating to the extending portions is the same as that of the insulating busbar 100 described in FIGS. 1 to 4. The front surface of the insulating busbar 100 refers to the surface that is opposite the back surface of the insulating busbar 100 from which the connection terminals 20 protrude. Furthermore, the side surface of the insulating busbar 100 refers to the surface between the front surface and the back surface of the insulating busbar 100. With this configuration, the size of the insulating busbar 100 in the horizontal direction can be reduced.

In each insulating busbar 100 described in FIGS. 1 to 5, electronic components such as electrical circuits or sensors may be provided within the resin portion 30. The electrical components may be electrically connected to the outside via the auxiliary circuit conductors 12.

Figure 6:
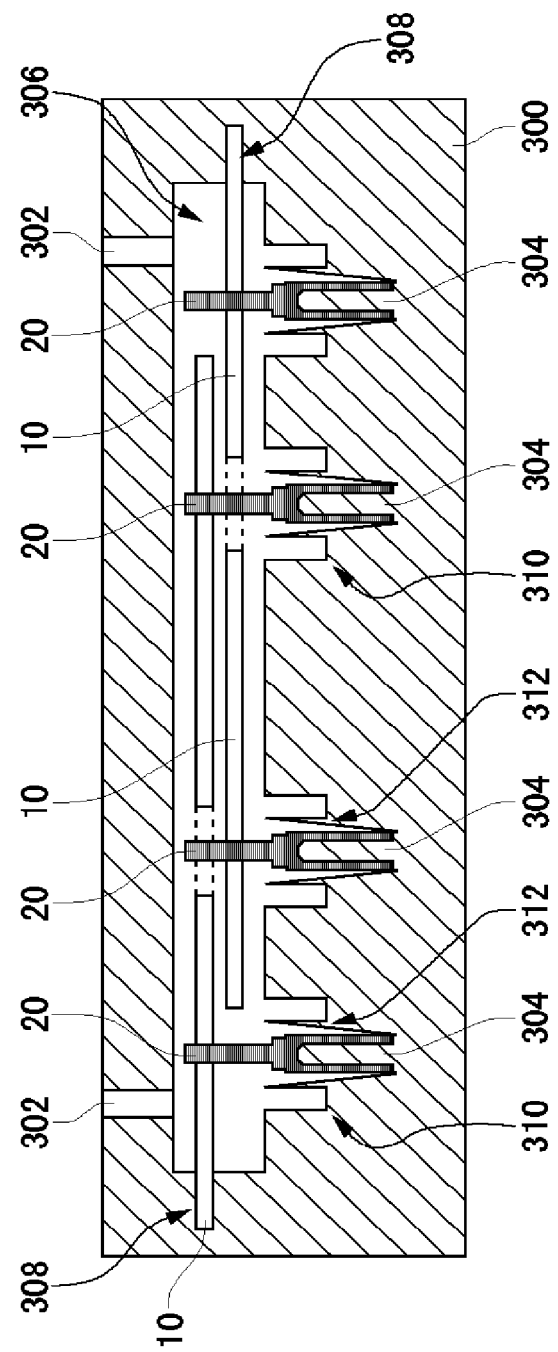
FIG. 6 is a cross-sectional view of an exemplary resin injection mold 300 for manufacturing the insulating busbar 100.

FIG. 6 is a cross-sectional view of an exemplary resin injection mold 300 for manufacturing the insulating busbar 100. First, the connection terminals 20 are connected to the main circuit conductors 10 and the auxiliary circuit conductors 12 that have been machined to the prescribed shape.

A resin injection mold 300 is prepared. The resin injection mold 300 may be divided into a bottom mold into which the main circuit conductors 10 and the like are placed and a top mold that functions as a lid for the bottom mold. FIG. 6 shows the top mold and bottom mold in a combined state. Position fixing grooves 308 are provided in the side walls of the bottom mold of the resin injection mold 300, at positions corresponding to the shapes of the extending portions of the main circuit conductors 10 and the like. Furthermore, position fixing protrusions 304 are provided on the base of the bottom mold of the resin injection mold 300, for positioning the main circuit conductors 10, the auxiliary circuit conductors 12, and the connection terminals 20 by engaging with the connection terminals 20. With this configuration, the main circuit conductors 10 and the like can be positioned and it is possible to prevent misalignment and deformation of the main circuit conductors 10 when the resin is injected.

The top mold is placed as a lid after the main circuit conductors 10 and the like have been arranged at the predetermined positions in the bottom mold of the resin injection mold 300. In this way, cavities 306 are formed inside the resin injection mold 300 corresponding to the shape of the resin portion 30 to be formed. The cavities 306 have grooves 312 and 310 corresponding respectively to the covering sections 32 and the uneven portions 34. Holes 302 are formed in the resin injection mold 300. The resin is injected through the holes 302. The holes 302 may be provided in the top mold or the bottom mold of the resin injection mold 300.

Next, the resin injection mold 300 and the main circuit conductors 10 and the like inside the resin injection mold 300 are heated to a prescribed temperature. The heating step may be omitted. During the heating step, oxidization of the main circuit conductors 10 and the like is preferably removed by using a reduction furnace.

Next, the mold resin is preheated and the catalyst solution or curing agent is mixed in while stirring. Next, the resin portion 30 is formed by injecting the mold resin through the holes 302 of the resin injection mold 300. The covering sections 32 and the uneven portions 34 of the resin portion 30 are also formed integrally in this step. At this time, the mold resin is injected slowly enough that air bubbles are not formed in the mold resin. Furthermore, the mold resin being injected preferably has a viscosity less than or equal to 10 Pa·s.

In the step of injecting the mold resin, the absolute pressure inside the resin injection mold 300 is reduced to be less than or equal to 80 kPa, to suck in the mold resin. As a result of this step, the resin portion 30 is formed such that there are no gaps around the main circuit conductors 10, the auxiliary circuit conductors 12, and the connection terminals 20.

The resin injection mold 300 into which the resin has been injected is held for a prescribed time at a first-order curing temperature of the mold resin, using a thermostatic chamber or furnace. After the prescribed time has passed, the insulating busbar 100 is removed from the resin injection mold 300. The insulating busbar 100 is then held for a prescribed time at a second-order curing temperature of the mold resin, using a thermostatic chamber or furnace.

After the prescribed time has passed, the insulating busbar 100 is cooled to room temperature. At this time, the cooling speed may be controlled such that the cooling is not sudden. After the cooling, an external observation examination, an electrical test, and the like are performed.

Figure 7:
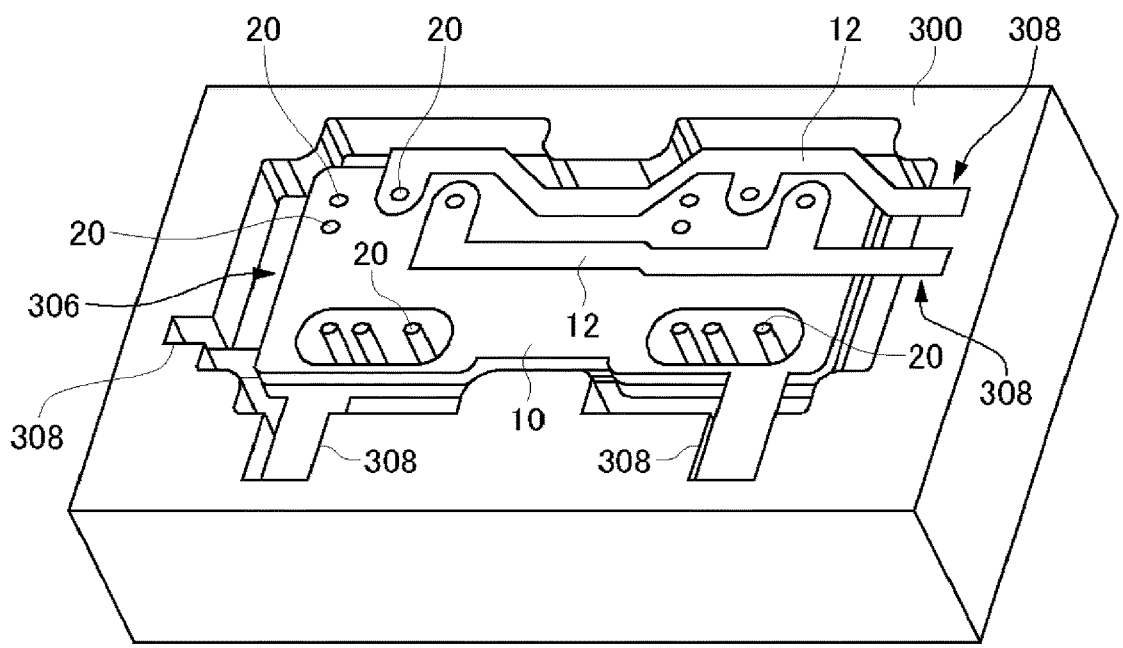
FIG. 7 is a perspective view of an exemplary bottom mold of the resin injection mold 300.

FIG. 7 is a perspective view of an exemplary bottom mold of the resin injection mold 300. As described above, a plurality of position fixing grooves 308 are formed on the side walls of the bottom mold of the resin injection mold 300. The position fixing groove 308 may hold the corresponding circuit conductors at a prescribed height. Furthermore, each main circuit conductor 10 may be provided with openings through which the connection terminals 20 connecting to other main circuit conductors 10 pass. Openings may also be formed in the main circuit conductors 10 arranged in the highest region. In this way, the resin can efficiently flow between the layered main circuit conductors 10.

Figure 8:
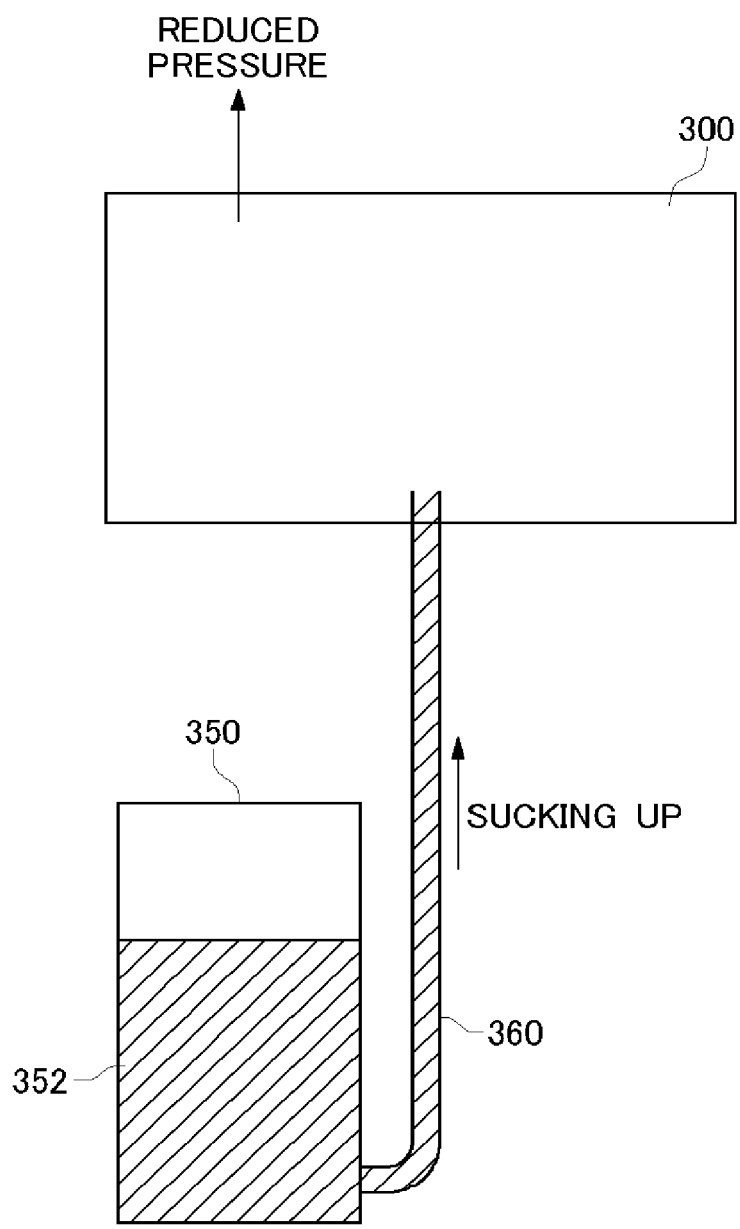
FIG. 8 shows an exemplary step of injecting the mold resin into the resin injection mold 300.

FIG. 8 shows an exemplary step of injecting the mold resin into the resin injection mold 300. In this example, a tube 360 is used to suck the resin 352 up into the resin injection mold 300 from a resin container 350 provided below the resin injection mold 300. Here, "below" refers to being lower in the direction of gravity.

Before the resin is injected in the manner described above, the absolute pressure within the resin injection mold 300 is reduced to be less than or equal to 80 kPa. In this way, the resin can be injected into the resin injection mold 300 using the tube 360. As shown in this example, the air bubbles are easily removed from the resin by sucking up the resin from below the resin injection mold 300 using the tube 360.

The insulating busbars 100 described in FIGS. 1 to 8 can be favorably used for semiconductor devices that operate at high voltage. For example, the insulating busbars 100 can be used for semiconductor devices that operate at high voltages greater than or equal to 3.3 kV, greater than or equal to 7 kV, or greater than or equal to 10 kV.

Silicon carbide semiconductor devices that have been developed in recent years operate at high voltages, but busbars with high withstand voltages that can be used for silicon carbide semiconductor devices have yet to be developed. The insulating busbar 100 can be used for such silicon carbide semiconductor devices, for example.

The entire insulating busbar 100, except for the extending portions of the main circuit conductors 10, is covered by the resin portion 30. Therefore, the end surfaces of the main circuit conductors 10 are not exposed from the resin portion 30. Accordingly, even when a plurality of the main circuit conductors 10 are layered, discharge at the end surface portions of the main circuit conductors 10 can be prevented. In other words, even if the distance between main circuit conductors 10 is small, discharge between main circuit conductors 10 can be prevented. Accordingly, the insulating busbar 100 can realize both low inductance and high withstand voltage.

On the other hand, a general laminated busbar has board-shaped conductors, insulating films, and spacers layered in an alternating manner. Such a busbar realizes low inductance by having a small distance between the conductors. However, since both end surfaces of each conductor are exposed, it is easy for discharge to occur at the end surfaces. Accordingly, when used in a way that requires a high withstand voltage, it is necessary to increase the distance between conductors, and therefore the inductance is increased. In other words, such a busbar cannot realize both high withstand voltage and low inductance.

As an example, if it is assumed that the rated voltage is to be doubled, with a laminated busbar, it is necessary to double the distance between conductors in order to prevent partial discharge at the ends. Furthermore, when a laminated busbar is provided with through-holes in order to be screwed to a module, it is necessary to ensure a creepage distance at both laminated surfaces, and therefore the busbar structure becomes larger. Yet further, since the insulating films and the like used in the laminated busbar have characteristics that change according to temperature, it is difficult to use a laminated busbar in high-temperature environments.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: main circuit conductor, 11: end, 12: auxiliary circuit conductor, 14: wall structure, 20: connection terminal, 22: base portion, 24: connecting portion, 26: insertion hole, 28: elastic portion, 30: resin portion, 32: covering section, 34: uneven portion, 100: insulating busbar, 200: module, 210: base, 212: wall structure, 222: connecting portion, 224: base substrate, 226: semiconductor chip, 228: connection terminal, 230: resin portion, 232: conduction pattern, 300: resin injection mold, 302: hole, 304: position fixing protrusion, 306: cavity, 308: position fixing groove, 310, 312: groove, 350: resin container, 352: resin, 360: tube

What is claimed is:

1. An insulating busbar that connects to a module on which is mounted a semiconductor chip,
    the insulating busbar comprising a plurality of circuit conductors; a plurality of connection terminals that respectively electrically connect the circuit conductors to the module; and
    an insulating resin portion that is formed integrally between each of the circuit conductors and at least a portion of a region around each connection terminal and does not have any gaps between the circuit semiconductors;
        wherein the resin portion has an uneven portion that expands a creepage distance between two of the connection terminals;
        wherein the uneven portion is provided between two of the connection terminals that are connected to different circuit conductors among the plurality of circuit conductors.

2. The insulating busbar according to claim 1, wherein the resin portion does not include the uneven portion between at least two of the connection terminals.

3. The insulating busbar according to claim 1, wherein at least one of the circuit conductors is covered by a material having a higher adhesiveness than nickel relative to the resin portion.

4. The insulating busbar according to claim 1, wherein the resin portion is formed by a catalytic curing resin.

5. The insulating busbar according to claim 1, wherein the resin portion is formed by a polyolefin resin or a maleimide resin.

6. The insulating busbar according to claim 1, wherein each connection terminal includes an insertion hole through which a corresponding terminal is inserted and an elastic portion that presses the corresponding terminal inside the insertion hole.

* * * * *